United States Patent [19]
Ditlow et al.

[11] Patent Number: 5,811,988
[45] Date of Patent: *Sep. 22, 1998

[54] PLA LATE SIGNAL CIRCUITRY USING A SPECIALIZED GAP CELL AND PLA LATE SIGNAL CIRCUITRY USING SWITCHED OUTPUT

[75] Inventors: Gary Stephen Ditlow, Garrison, N.Y.; Paul David Kartschoke, Williston, Vt.

[73] Assignee: International Business Machines Corporation, Armonk, N.Y.

[ * ] Notice: The term of this patent shall not extend beyond the expiration date of Pat. No. 5,717,344.

[21] Appl. No.: 915,204

[22] Filed: Aug. 20, 1997

Related U.S. Application Data

[62] Division of Ser. No. 603,662, Feb. 20, 1996, Pat. No. 5,717,344.

[51] Int. Cl.⁶ .................................................. H03K 19/177
[52] U.S. Cl. ............................. 326/39; 326/41; 364/490
[58] Field of Search ................................. 326/39, 41, 42, 326/44–45, 49–50, 17; 364/489–490

[56] References Cited

U.S. PATENT DOCUMENTS

| | | | |
|---|---|---|---|
| 4,503,387 | 3/1985 | Rutledge et al. | 326/39 |
| 4,893,033 | 1/1990 | Itano et al. | 326/44 |
| 5,033,017 | 7/1991 | Taniai et al. | 326/44 |
| 5,083,047 | 1/1992 | Horie et al. | 326/45 |
| 5,717,344 | 2/1998 | Ditlow et al. | 326/39 |

*Primary Examiner*—Jon Santamauro
*Attorney, Agent, or Firm*—Eugene I. Shkurko

[57] ABSTRACT

An apparatus for redirecting late-entering PLA input signals to avoid holding up the entire PLA while the late-entering signals are processed, and a method for designing the same.

4 Claims, 6 Drawing Sheets

The PLA using the invention with an AND circuit for the specialized gap cell

Typical PLA structure

The PLA using the invention with an AND circuit
for the specialized gap cell

The PLA using the invention with an inverter-NOR circuit for the specialized gap cell The PLA using the invention with a partitioned OR circuit and different gap cells.

Typical PLA structure with the OR array partitioned

The PLA using the invention with the OR array specially partitioned

PLA LATE SIGNAL CIRCUITRY USING A SPECIALIZED GAP CELL AND PLA LATE SIGNAL CIRCUITRY USING SWITCHED OUTPUT

This is a divisional of application Ser. No. 08/603,662 filed on Feb. 20, 1996, now U.S. Pat. No. 5,717,344.

CROSS-REFERENCE TO RELATED APPLICATIONS

U.S. patent application Ser. No. 08/603,661, entitled "A PROGRAMMABLE LOGIC ARRAY AND METHOD FOR ITS DESIGN USING A THREE STEP APPROACH", IBM Docket #BU9-96-009, filed concurrently herewith is assigned to the same assignee hereof and contains subject matter related, in certain respect, to the subject matter of the present application. The above-identified patent application is incorporated herein by reference.

BACKGROUND OF THE INVENTION

1. Technical Field of the Invention

This invention pertains to Programmable Logic Arrays (PLAs). In particular, this invention solves problems associated with the propagation delay through a PLA when there is a late (delayed) signal entering the PLA.

2. Background Art

The need for quick turn around time for the generation of logic is well known. PLAs help tackle this need in that they can be easily automated in their creation. The propagation delay through PLAs is of particular concern on high performance chips. One problem that may occur in PLAs with respect to their propagation delay is the occurrence of late signals entering a PLA that can increase the total propagation time of the PLA. These late signals can affect many of the outputs, producing severe propagation delays that occur in many of the input to output transitions.

It is an object of the invention to provide a PLA which avoids or reduces the effect of late-entering signals on the total PLA propagation delay.

It is another object of the invention to provide a method of redesigning or redirecting signal paths associated with late-entering signals so that overall PLA performance is improved.

SUMMARY OF THE INVENTION

From a prior global timing analysis, late signals entering a PLA can be identified. These late signals can adversely affect the propagation time of the whole PLA. Based on information gathered from the timing analysis, the invention described herein solves the late signal propagation delay problem by redirecting the late signals through the PLA via circuitry within the PLA to redirect the flow of data through the PLA. This effectively provides correct PLA performance even for late signals arriving as late as when a signal passing through the worst delay path through the AND array reaches the AND array outputs (at the gap cells) or, optionally, as late as when the worst signal delay path propagates a signal through the combination of both the AND array and the OR array.

This invention solves the timing problem associated with late signals entering PLAs. Described here is a unique and novel solution to the late signal propagation delay problem within PLAs by removing the offending late signal from the original PLA signal path and redirecting it into bypass circuits within the PLA that allow this late signal to be recombined with the rest of the PLA signals downstream from the PLA inputs.

Other features and advantages of this invention will become apparent from the following detailed description of the presently preferred embodiment of the invention, taken in conjunction with the accompanying drawings.

BEST MODE FOR CARRYING OUT THE INVENTION

Figure 1:
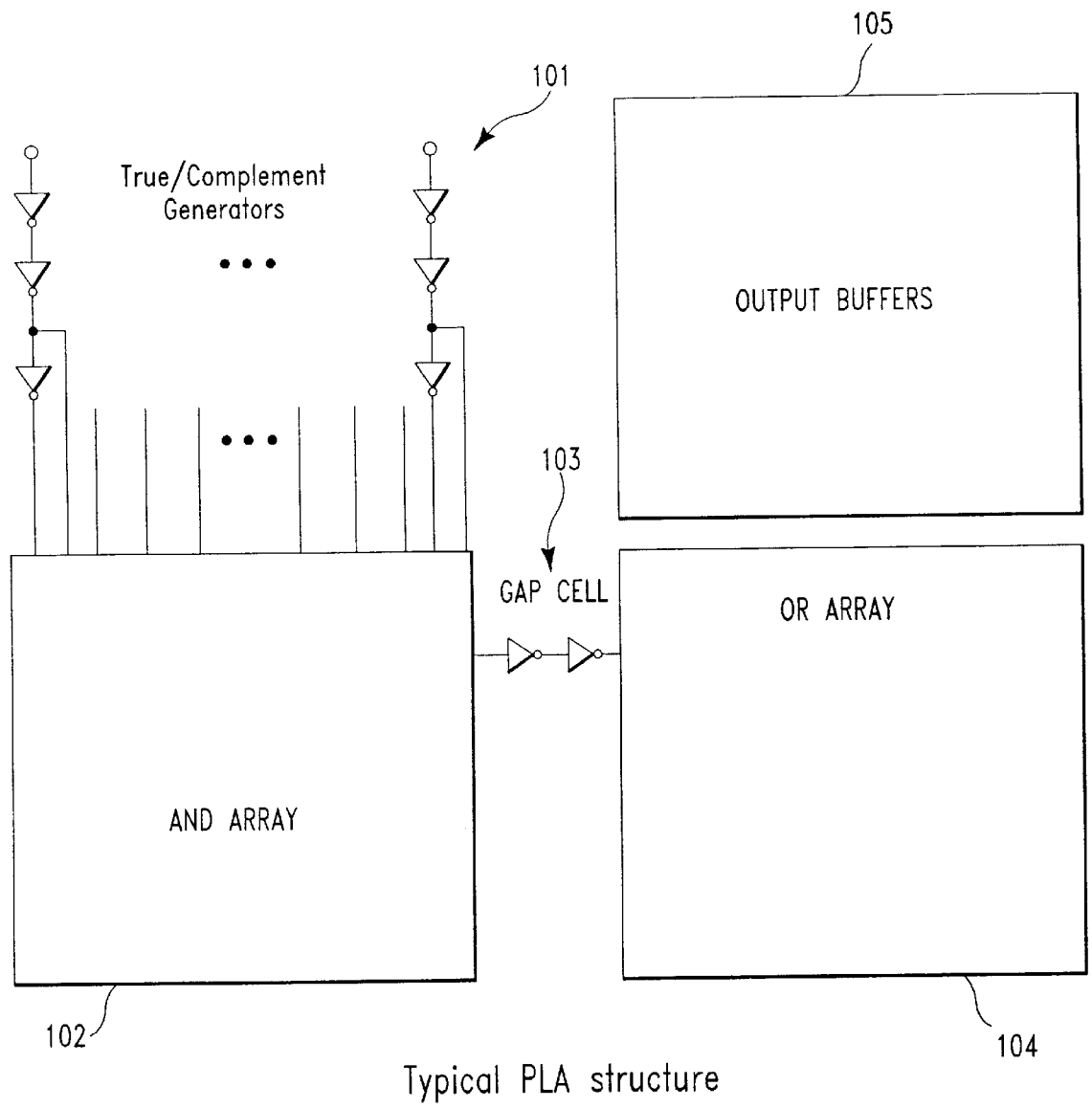
FIG. 1 illustrates a typical PLA structure.
Figure 2:
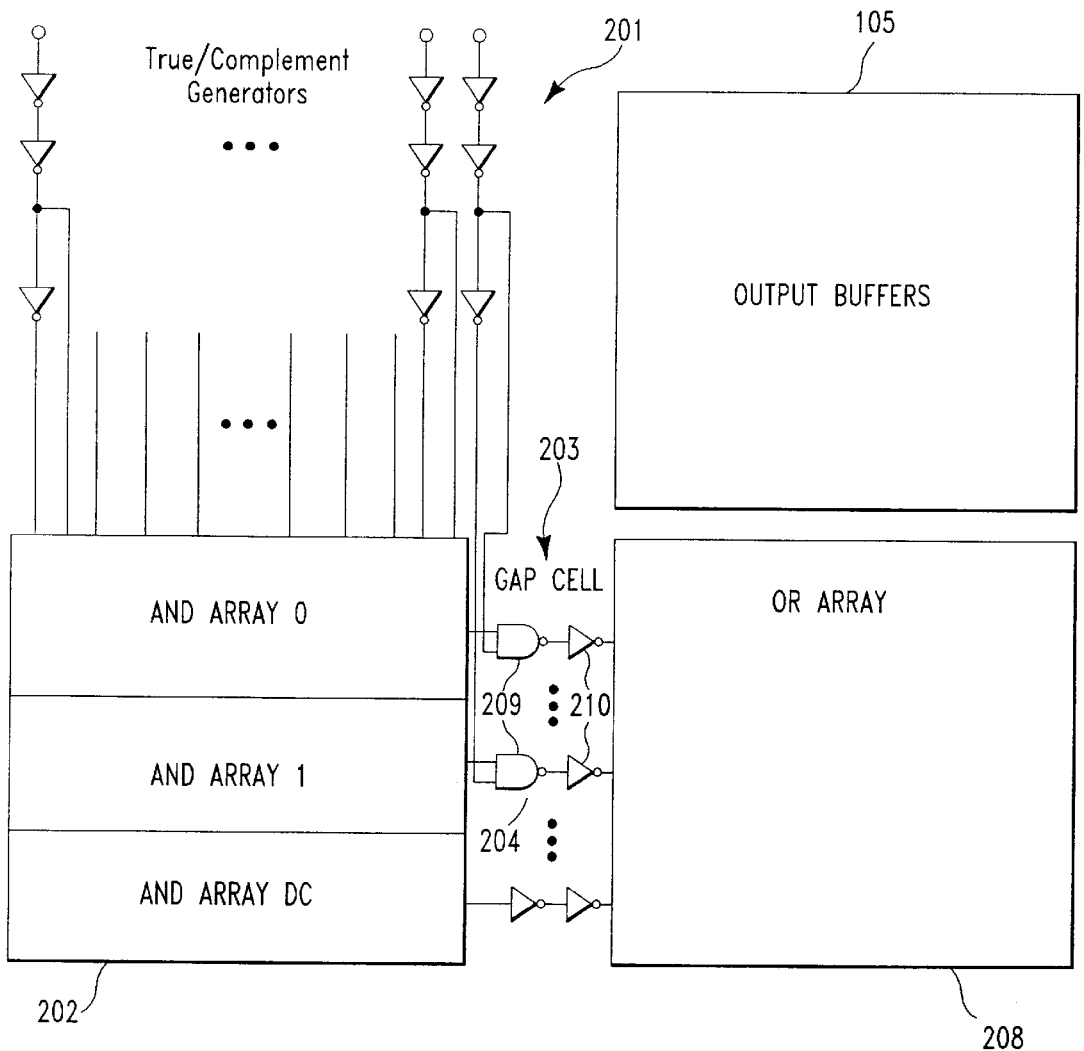
FIG. 2 illustrates a PLA using the invention with a NAND circuit for the specialized gap cell.
Figure 3:
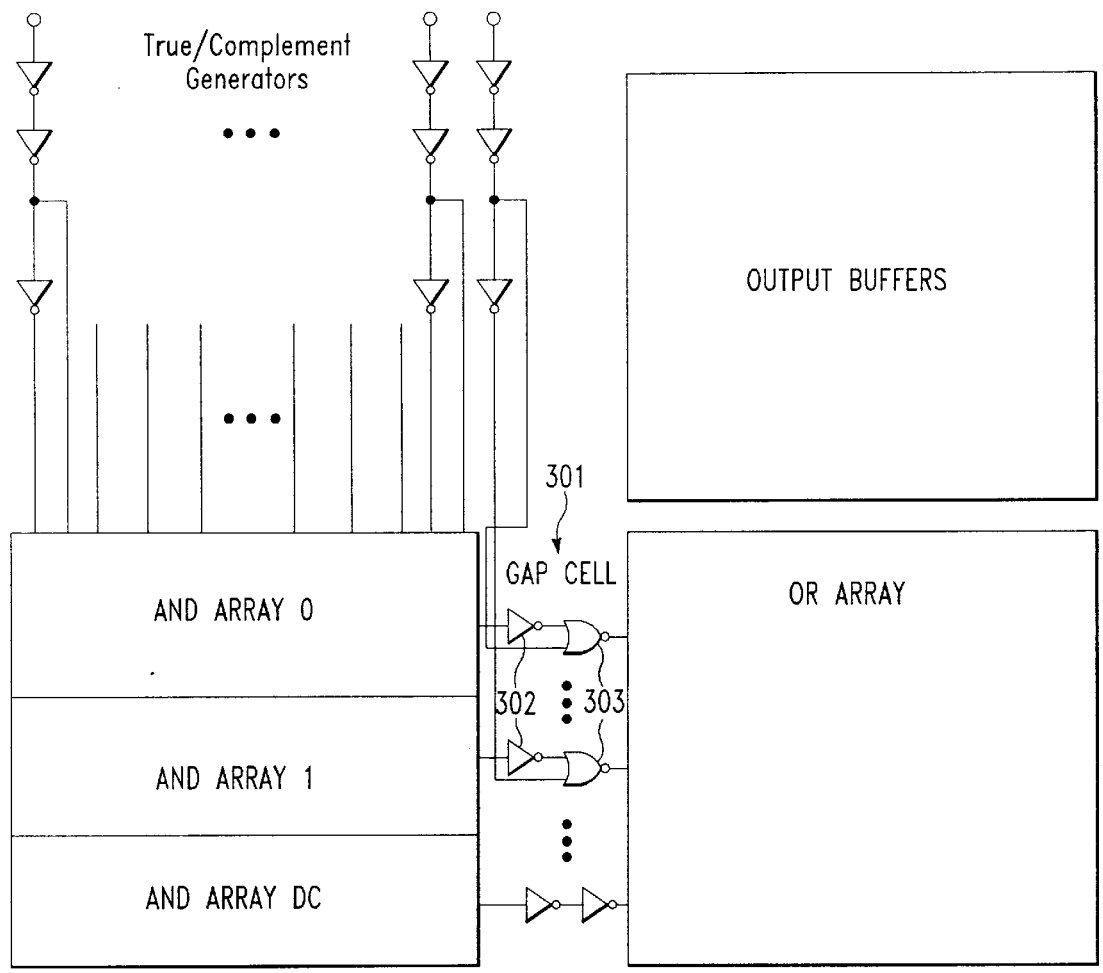
FIG. 3 illustrates a PLA using the invention with an inverter-NOR circuit for the specialized gap cell.

FIG. 1 shows the prior art which represents a typical PLA. It contains a true/complement generation segment 101, an AND array 102, a gap cell 103, an OR array 104, and an output buffer segment 105. In FIGS. 2 & 3 we show two embodiments of our invention.

Referring to FIG. 2, the first modification for increasing the speed of a PLA that receives a late input signal involves moving the late signal's true/complement (t/c) generator 201 above the gap cell region of the PLA and using this signal to select between the 0 set or the 1 set inside of the logically partitioned AND array 202. This allows the signal to come in as late as the slowest transition within the AND array, i.e. the late signal will not exacerbate any delay within the PLA if it arrives at its corresponding gap cells 203, 204 at the same time the corresponding product term is output from the AND array 202 (the late signal t/c generator may be coupled to one, some, or all the gap cells). The AND array 202 comprises ratioed logic, which is well known in the art and is not described further, to avoid timing problems between the product terms and the late entering signals arriving at the gap cells.

In our invention we first moved the late-entering signal from its original PLA location and logically partitioned the resulting AND array 202 into three sections 205, 206, 207. These three sections contain the 0 function (sec. 205), the 1 function (sec. 206), and the don't care (DC) functions (sec 207) associated with this late signal. We then placed the t/c circuitry 201 associated with this late signal, previously used within the normal PLA, above the gap cell into an area normally unused. This gap cell true/complement generator now feeds directly into the modified gap cells 203, 204 to control them. These modified gap cells use the true & complement signals from the late-entering signal to control whether the 0 function or the 1 function inside of the AND array should be transmitted. The don't care signal function acts as it had previous to these changes.

The partitioning of the original PLA into the 0 205, 1 206, and DC 207 functions of the late signal can serve to further minimize the AND array, if the product terms contain related terms, producing an even smaller & faster PLA than the original. Bypassing the PLA in the manner described herein may render certain of the product terms redundant. By minimizing the 0 and the 1 functions, these functions can be collapsed if the product terms contain these redundancies.

Figure 4:
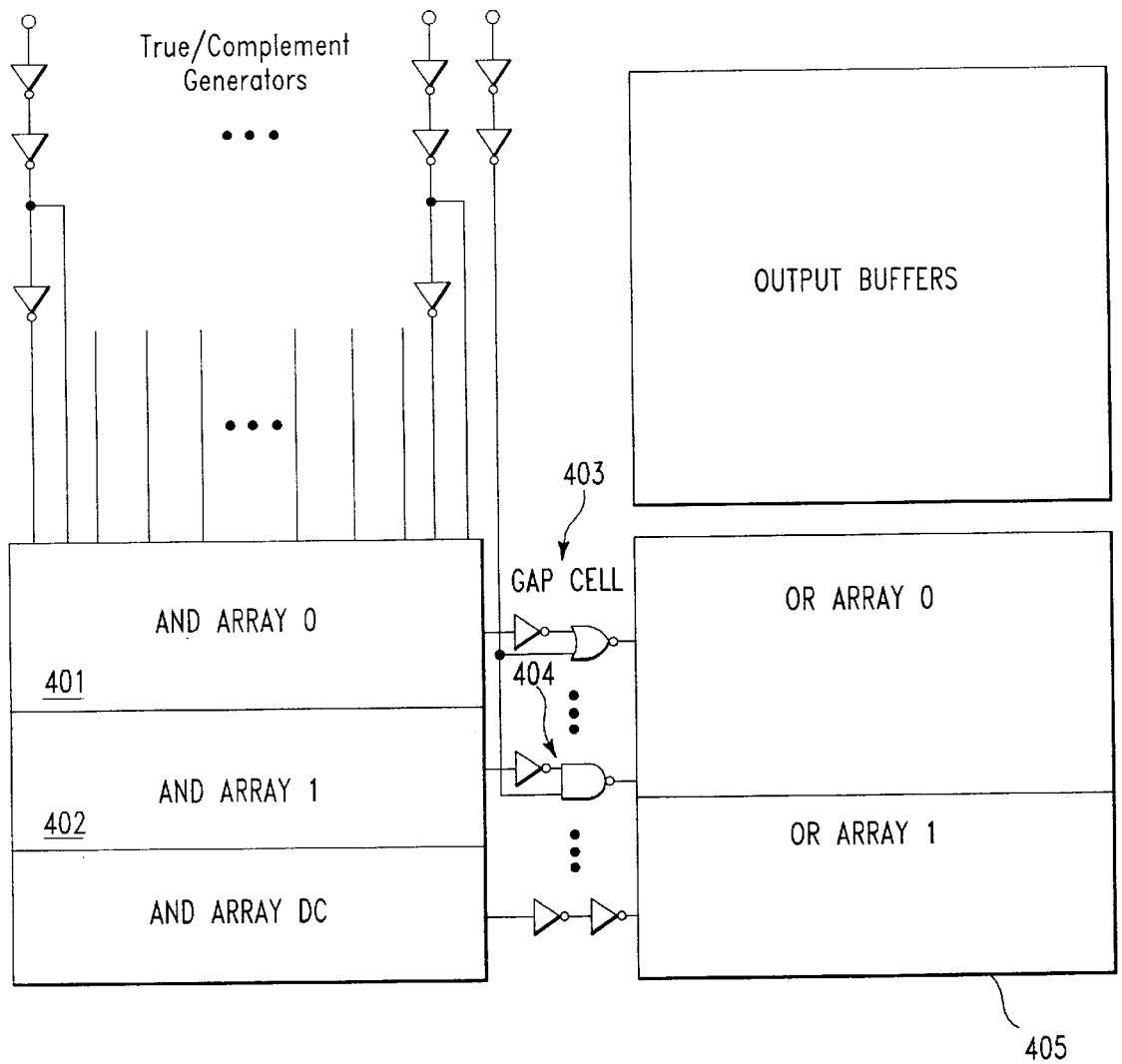
FIG. 4 illustrates the PLA using the invention with a partitioned OR array and mixed gap cell types.

The specialized gap cell may be created in several ways. In FIGS. 2, 3, & 4 we show possible ways of creating specialized gap cells. FIG. 2 shows how we have used NAND cells 209 and inverters 210 to control the propagation of the product term signals from the AND array 202 to the OR array 208. In FIG. 3 we have shown specialized gap cells 301 which contain inverters 302 followed by NOR circuits 303. In FIG. 4 we show the gap cells 403, 404 to be unique for the AND array 0 401 and the AND array 1 402. We also show, in FIG. 4, the OR array 405 physically partitioned to reduce loading (and as in FIGS. 5–6). Also shown are non-complemented signals transmitted to the gap cells. All of these examples illustrate various embodiments of the present invention.

Effectively this invention allows a late signal to arrive at a later time than in previous designs without sacrificing proper PLA performance. The extra time that the late signal is allotted is equivalent to the slowest AND array transition that corresponds to the late signal's function. In these examples we have shown this invention used on a single late signal. The present invention could easily be expanded to handle two or more late signals with some obvious changes to the circuitry (redirecting more t/c generators). We have shown how to take a late signal and allow it to arrive as late as the worst case delay within the AND array by using a specially modified gap cell.

Figure 5:
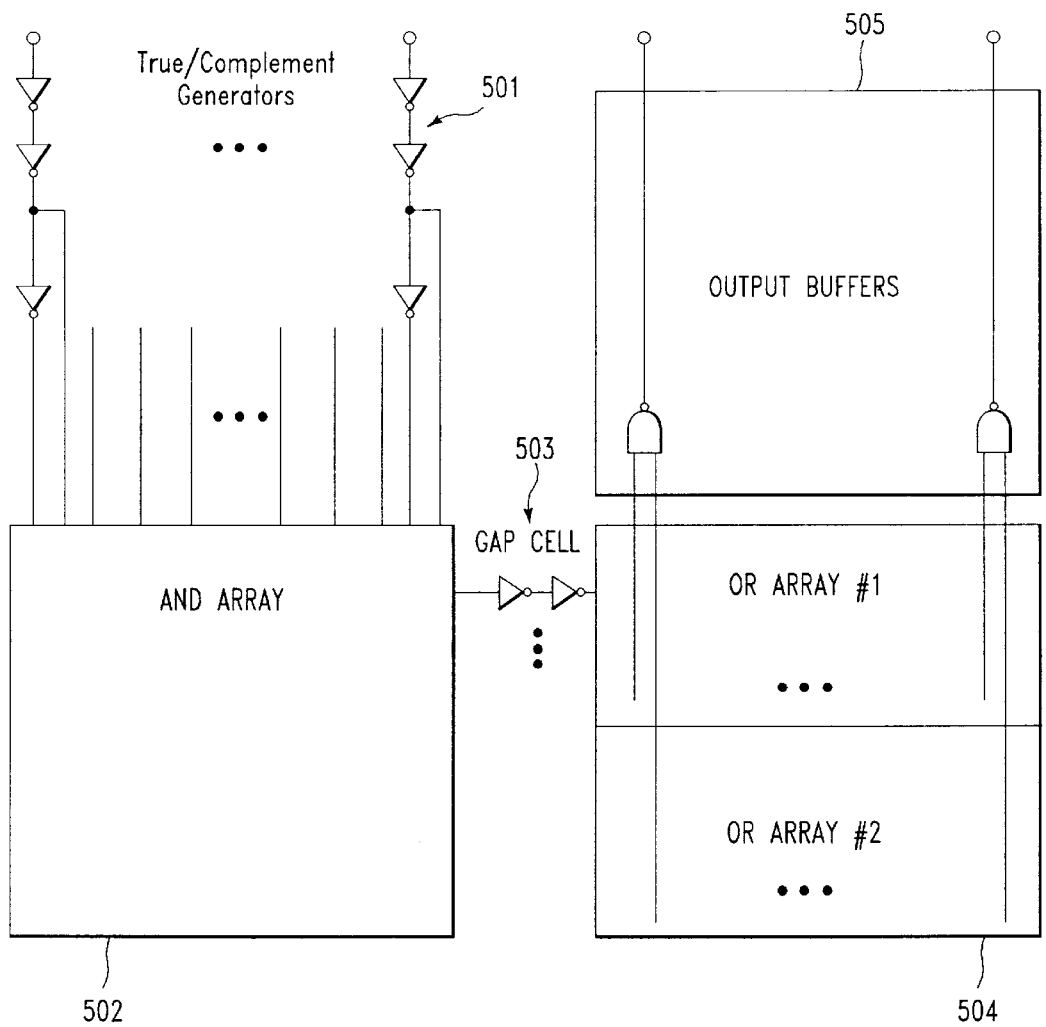
FIG. 5 illustrates a typical PLA structure with the OR array partitioned.
Figure 6:
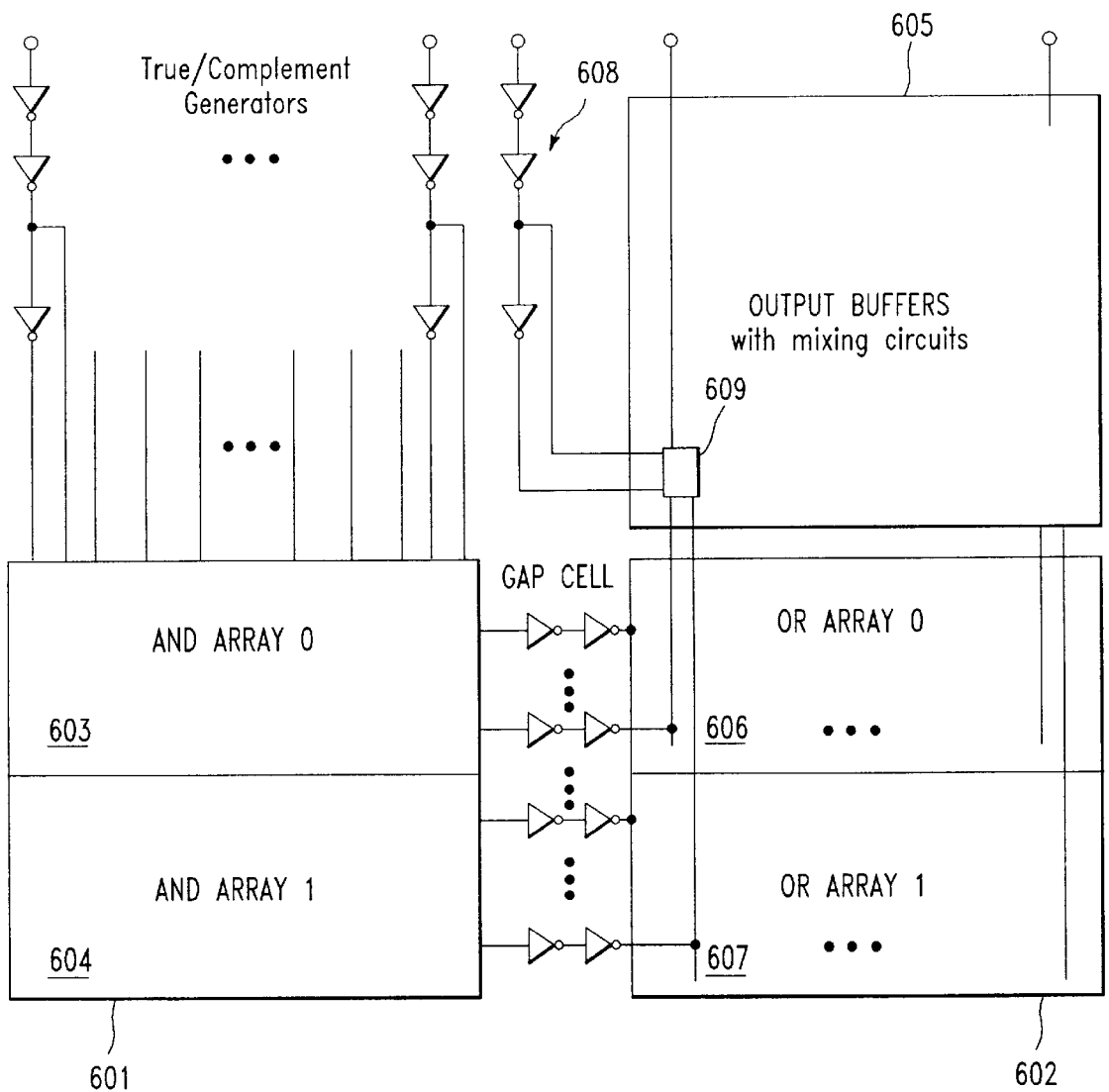
FIG. 6 illustrates a PLA using the invention with the OR array partitioned.

FIG. 5 shows the prior art which represents a typical PLA where the OR array has been physically partitioned (i.e. the output buffer lines do not extend through the entire PLA) to help increase speed. It contains a true/complement generation segment 501, an AND array 502, a gap cell 503, a partitioned OR array 504, and an output buffer segment 505. In FIG. 6 we show an example of our invention implemented in the circuit of FIG. 5.

The second modification described herein involves circuitry which permits the late signal to arrive as late as the worst case delay through both the AND array and the OR array without effecting overall PLA performance. We achieve this by having a 0 OR array (for the On set) and a 1 OR array (for the Off set), we then select between these two sets in the output buffering section. A switch transmits a signal from one of the 2 sets in response to signals from the input t/c generators.

Referring to FIG. 6, which illustrates example circuit connections, we first move the circuitry carrying the late signal from the original PLA AND array 601 and partition it into two sections 603, 604. These two sections contain the 0 function 603 and the 1 functions 604 associated with the late signal. Next, we partition the OR array 602 into two sections. One section 606 represents the 0 function and a second section 607 represents the 1 function corresponding to the late signal. Then we place the t/c circuitry 608 associated with this late signal above the gap cell, an area that is typically unused. This true/complement generator 608 now feeds into the output cells 609 (e.g. a mux). An example cell (switch) 609 is shown which transmits one of the 0 and 1 functions in response to input signals from the input t/c generator 608. These output cells 609 now contain a different circuit than in the prior art for selecting between the 0 and the 1 functions sent from the OR array. Previously, as seen in FIG. 5, this circuit was a NAND gate used to recombine the previously partitioned signals. The new output cell that we use herein could be passgates followed by an inverter, two tri-inverters used as a mux (multiplexer), or any other mux type circuitry.

The logical function of the PLA is maintained by a two step process. First, the gap cells 203, 204 control whether the 0 function or the 1 function propagates into the OR array 208. Second, the OR array contains a crosspoint (e.g. an NFET) for both the 0 function and the 1 function on the OR lines that correspond to the late signal (see FIG. 6). Therefore, the combination of the specialized gap cells 203, 204 and the existing OR array 208, containing crosspoint connections for both the 0 & 1 functions, preserves the total functionality of the original PLA.

As described above, the original partitioning of the PLA into the 0, and 1 functions of the late signal can serve to further minimize the PLA, producing an even smaller & faster PLA than the original.

ALTERNATIVE EMBODIMENTS

It will be appreciated that, although specific embodiments of the invention have been described herein for purposes of illustration, various modifications may be made without departing from the spirit and scope of the invention. In particular, we have shown here how to allow a single late signal to arrive and be recombined within the PLA. We may also have more than one late signal used with this invention. For example if there were two late signals we would need an AND array 00,01,10, and 11. If we were selecting the late signal during the output buffering we would also need OR arrays 00, 01, 10, and 11. Accordingly, the scope of protection of this invention is limited only by the following claims and their equivalents.

We claim:

1. A programmable logic array (PLA) comprising:
   a plurality of true/complement generators each receiving PLA input signals, wherein at least one of the true/complement generators receives a late-entering input signal;
   an AND array coupled to the true/complement generators;
   a plurality of gap cells coupled to the AND array for transmitting AND array output signals; and
   said at least one of the true/complement generators that receives the late entering input signal bypassing the AND array and coupled directly to at least one of the gap cells.

2. The PLA of claim 1 wherein said at least one of the gap cells comprises a gate coupled to the AND array for receiving one of the AND array output signals and to said at least one of the true/complement generators that receives the late-entering input signal for combining said one of the AND array output signals with the late-entering signal from said at least one of the true/complement generators.

3. The PLA of claim 2 wherein said gate is coupled to the AND array through an inverter.

4. A programmable logic array (PLA) comprising:
   true/complement generators each receiving PLA input signals, wherein at least one of the true/complement generators receives a known late-entering input signal;
   an AND array coupled to a plurality of the true/complement generators;
   an OR array coupled to the AND array through a plurality of gap cells;
   output circuits for outputting OR array outputs; and
   said at least one of the true/complement generators that receives the known late-entering signal, bypassing the AND array and the OR array, coupled directly to at least one of the output circuits.

* * * * *